United States Patent

Ling et al.

[11] Patent Number: 5,963,780
[45] Date of Patent: Oct. 5, 1999

[54] METHOD FOR DETECTING DEFECT SIZES IN POLYSILICON AND SOURCE-DRAIN SEMICONDUCTOR DEVICES

[75] Inventors: Zhi-Min Ling, San Jose; Yung-Tao Lin, Fremont; Ying Shiau, San Jose, all of Calif.

[73] Assignee: Advanced Micro Devices, Inc., Sunnyvale, Calif.

[21] Appl. No.: 08/899,739

[22] Filed: Jul. 24, 1997

Related U.S. Application Data

[62] Division of application No. 08/477,384, Jun. 7, 1995, Pat. No. 5,670,891.

[51] Int. Cl.$^6$ .............................. H01L 21/66; G01R 31/26
[52] U.S. Cl. ........................... 438/14; 438/238; 438/382; 438/648
[58] Field of Search .............................. 438/5, 238, 241, 438/381–385, 4, 12, 14, 648

[56] References Cited

U.S. PATENT DOCUMENTS

| | | |
|---|---|---|
| 4,100,486 | 7/1978 | Casowitz et al. . |
| 4,835,466 | 5/1989 | Maly et al. . |
| 5,051,690 | 9/1991 | Maly et al. . |
| 5,635,418 | 6/1997 | Roberts ..................................... 438/384 |
| 5,656,524 | 8/1997 | Eklund et al. ........................... 438/238 |

OTHER PUBLICATIONS

Jitendra B. Khare et al., "Extraction of Defect Size Distributions in an IC Layer Using Test Structure Data", IEEE, Transactions on Semiconductor Manufacturing, vol. 7, Aug. 1994.

Primary Examiner—Jey Tsai

[57] ABSTRACT

An apparatus and method for detecting defect sizes in polysilicon and source-drain semiconductor devices and methods for making the same. Implemented is a double bridge test structure that includes a resistor path of first semiconductor material, such as doped silicon comprising a plurality of strip segments and with interconnection segments. A plurality of strips of second semiconductor material having a substantially lower resistivity are connected to form parallel circuit interconnections with the corresponding strip segments. The test structure is formed by masking techniques wherein a prescribed mask region enables portions of the silicon resistor or deposited polysilicon to be selectively silicided to form silicide and polycide, respectively. One embodiment for testing for defects in a polysilicon layer uses polycide as the low-resistivity strips, enabling the testing of open and short-circuit defects. A second embodiment selectively silicides exposed portions of a source-drain resistor, thereby enabling testing for defects in a source-drain layer of a metal oxide semiconductor. Defect sizes are determined by comparing the measured resistance values with predetermined width and spacings of the strips.

10 Claims, 7 Drawing Sheets

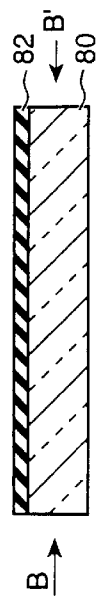
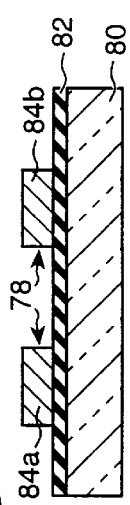
Fig. 6B　　Fig. 6C　　Fig. 6D　　Fig. 6E　　Fig. 6F
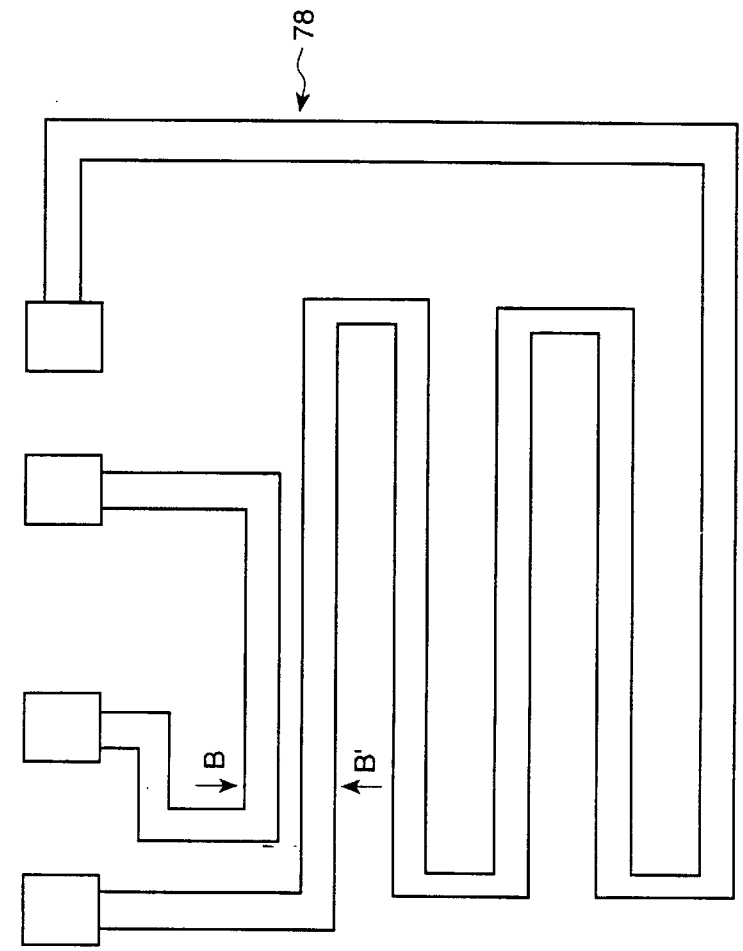
Fig. 6A

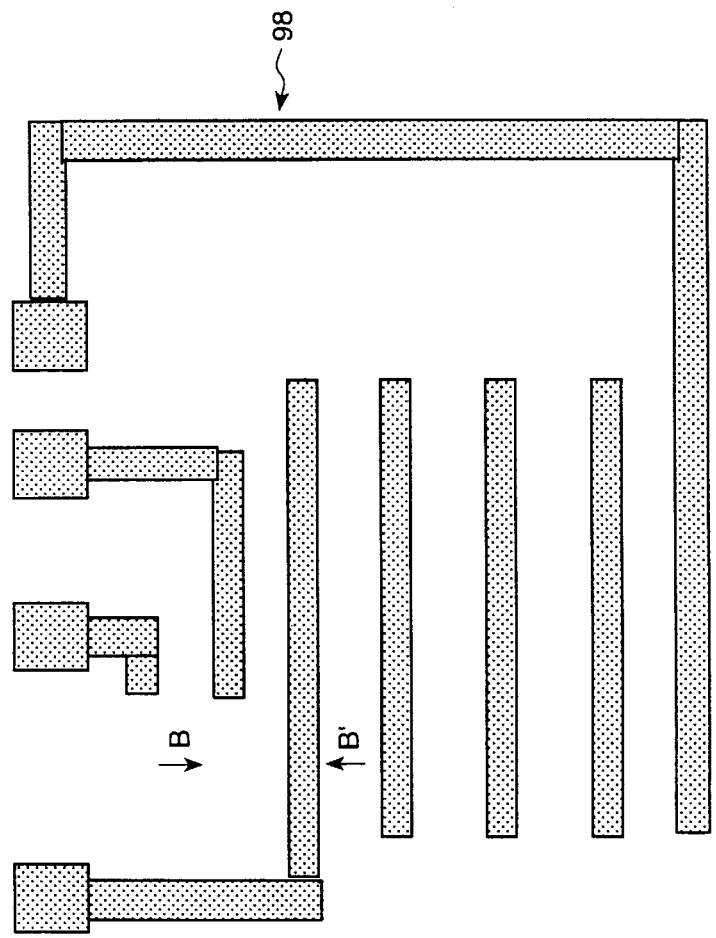
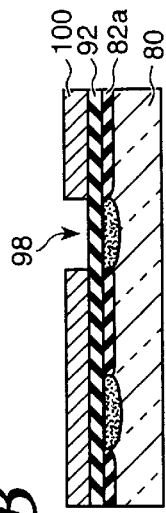
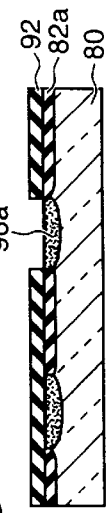
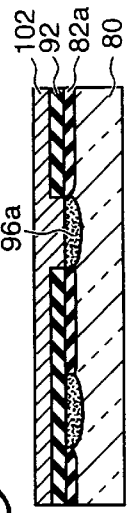
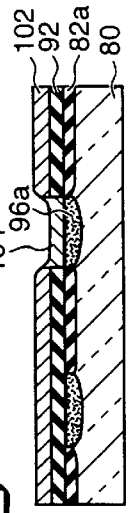

METHOD FOR DETECTING DEFECT SIZES
IN POLYSILICON AND SOURCE-DRAIN
SEMICONDUCTOR DEVICES

This application is a division of application Ser. No. 08/477,384 filed Jun. 7, 1995, now U.S. Pat. No. 5,670,891.

FIELD OF THE INVENTION

The present invention relates to an apparatus and method for determining sizes of spot defects formed during fabrication of integrated circuits.

DESCRIPTION OF THE RELATED ART

One of the most important objectives of modern semiconductor manufacturing is maximizing the yield of integrated circuits. An important technique for providing accurate yield prediction is determining the size distributions of defects and their effects on the actual circuit layout. A defect is defined as a deformity in the form of extra or missing material in a layer of a circuit, typically caused by contaminants such as an unwanted particle or a droplet of liquid which falls on the wafer during the manufacturing process.

A technique for detecting and extracting defect size distributions in integrated circuits has been proposed in U.S. Pat. No. 4,835,466, to Maly, and in Khare et al., "Extraction of Defect Size Distributions in an IC Layer Using Test Structure Data", IEEE Transactions on Semiconductor Manufacturing, Volume 7, No. 3, August 1994, pp. 354–368, the disclosures of which are incorporated herein by reference. Maly and Khare et al. propose detecting the sizes of spot defects using a double bridge test structure (DBTS) defined by three masks. The proposed double bridge test structure is fabricated by covering a silicon substrate with an oxide layer of about 6000 angstroms (Å) in thickness. A polysilicon meander is then laid down on the oxide. Oxide is deposited on the meander and contact cuts are etched in the oxide using the contact layer mask. Finally, metal is deposited, patterned and etched to complete the structure comprising a set of parallel metal strips that cover the straight segments of the polysilicon meander. The metal strips are connected to the meander through the insulating oxide layer by the contact cuts.

The structure proposed by Maly and Khare et al. is limited to determining defect sizes for metal defects, and is unable to obtain defect size information for semiconductor materials such as polysilicon. For example, Khare et al. indicates that the proposed double bridge test structure may be used for different metal layers, but does not suggest an approach for testing polysilicon defects. Moreover, Khare et al. indicates that care must be taken to minimize defects in the polysilicon layer, which can adversely affect the performance of the double bridge test structure.

In addition, the proposed double bridge test structure is unusable for testing defects from polysilicon fabrication because the polysilicon-forming process is a relatively high temperature process that exceeds the melting point of metal, approximately 400° C. Thus, if an attempt is made to use the proposed double bridge test structure, the metal of the proposed DBTS will melt during formation of a polysilicon layer, possibly contaminating the furnace being used. Therefore, the proposed double bridge test structure is inapplicable in testing defects in polysilicon layers.

Another disadvantage of the proposed double bridge test structure is its relative complexity, with three masks required to form the circuit. As a result, the proposed Maly structure cannot be used in testing for higher-density device defects, such as defects in source-drain layers of metal oxide semiconductor (MOS) devices. A MOS structure uses built-up silicon for the source-drain layer. However, the proposed double bridge test structure requires at least two layers, namely the polysilicon layer and the metal layer. Thus, since additional layers cannot be added underneath the source-drain layer, the proposed double bridge test structure is unusable for testing defects in a source-drain layer.

SUMMARY OF THE INVENTION

In view of the foregoing, there is a need for testing for defects in semiconductor layers other than metal layers. For example, there is a need for testing for defects in polysilicon layers of semiconductor devices.

There is also a need for testing for defects in semiconductor devices utilizing high-temperature fabrication processes above the melting point of metals.

There is also a need for testing for defects in high-density semiconductor devices. Such testing requires relatively simple test structures having a minimum number of layers.

There is also a need for test structures composed of semiconductor materials having substantially different resistivity values to distinguish circuit paths created by defects in the semiconductor layers.

These and other needs are met by the present invention, which provides an apparatus and method for detecting defect sizes on a semiconductor. The apparatus of the present invention comprises a resistor path of first semiconductor material comprising a plurality of strip segments and interconnection segments of first resistivity, a plurality of strips of second semiconductor material having a second resistivity and connected to corresponding strip segments to form a double bridge test structure, wherein the first resistivity is substantially different than the second resistivity. The method of the present invention comprises the steps of measuring a first resistance value of the interconnection segments, measuring a second resistance value between the ends of the double bridge structure, and calculating a ratio between the measured first and second resistance values, the ratio corresponding to the defect size in accordance with the predetermined width and spacing of the strip segments.

According to the present invention, a plurality of strips of a semiconductor material having a first resistivity are connected in parallel with strips of a second semiconductor material having a substantially different resistivity. Hence, the measured resistance of the overall test structure is based on the existence of defects in one of the semiconductor layers. Since the present invention uses different-resistivity semiconductors as opposed to metal for testing defects, the present invention can test for defects in semiconductor layers such as polysilicon or source-drain layers of a metal oxide semiconductor.

In addition, the use of different-resistivity semiconductors in the present invention provides additional flexibility in testing using different fabrication techniques. Hence, the present invention enables testing of semiconductor layers using high-temperature fabrication techniques above the melting point of metal.

The present invention also provides a method for forming a test structure for testing defects in a polysilicon layer, comprising the steps of forming an oxide layer on a silicon substrate, forming an implant mask on the oxide layer defining a first prescribed region, implanting the first prescribed region with a dopant to form a silicon resistor strip, forming an interconnect mask on the oxide layer defining second prescribed regions, etching the oxide layer at the second regions, depositing a polysilicon layer overlying the silicon resistor strip and the oxide layer, selectively masking the polysilicon layer at third prescribed regions such that portions of the polysilicon layer remain exposed, etching the exposed polysilicon layer portions, depositing a refractory metal silicide layer overlying the second and third prescribed regions, and applying heat to cause the deposited refractory metal silicide to react with a portion of the silicon resistor strip exposed at the second prescribed regions and the polysilicon at third prescribed regions to form silicide and polycide as connecting portions and low-resistivity portions, respectively.

According to the method for forming a polysilicon test structure according to the present invention, the silicon resistor strip and the polysilicon layer are selectively masked to define prescribed regions that are exposed to a deposited refractory metal silicide. The exposed portions of the polysilicon and silicon react with the deposited refractory metal silicide upon application of heat to form polycide and silicide, respectively. Thus, the polysilicon test structure can be formed by selectively siliciding the silicon resistor layer and the polysilicon layer.

The present invention also provides a method for forming a test structure for testing defects in a source-drain layer, comprising the steps of forming an oxide layer on a silicon substrate, forming a source-drain mask on the oxide layer defining a first prescribed region, depositing a resistor protect oxide layer overlying at least an etched portion of the oxide layer, implanting dopant on the semiconductor to form a resistor pattern at the first prescribed region, selectively etching the resistor protect oxide layer to define a second prescribed region, depositing a refractory metal silicide layer overlying the resistor protect oxide layer, and applying heat to cause the deposited refractory metal silicide to react with at least a portion of the resistor pattern at the second region to form a silicide pattern coincidental with said portion of said resistor pattern.

According to the method for forming a test structure for testing source-drain layer defects according to the present invention, the silicon resistor strip is selectively masked by the resistor protect oxide layer to selectively silicide the silicon resistor pattern. Thus, by directly siliciding exposed portions of the silicon resistor, the test structure for testing the source-drain layer is formed within the semiconductor layer of the source-drain region, resulting in a test structure that is sufficiently compact in size for testing of high-density devices.

These and other advantages of the present invention will become more readily apparent upon review of the attached drawings and the accompanying detailed description of the best modes for carrying out the invention.

BRIEF DESCRIPTION OF THE DRAWINGS

Reference is made to the attached drawings, wherein elements having the same reference numeral designations represent like elements throughout and wherein:

FIGS. 6A–6F disclose a source drain mask and method for forming the resistor pattern of the test structure of FIG. 5.

FIGS. 7A–7F disclose the resistor protect mask and method for forming the silicide strips and electrodes of the structure of FIG. 5.

BEST MODES FOR CARRYING OUT THE INVENTION

According to the present invention, a test structure for determining defect sizes comprises a resistor path formed of a first semiconductor material having a first resistivity and a plurality of strips formed of a second semiconductor material having a substantially different resistivity, wherein the resistor path and the plurality of strips have parallel interconnections to form an improved double bridge test structure without metal strips. The first disclosed embodiment tests defect sizes in polysilicon layers, whereas the second tests defect sizes in source-drain layers.

Figure 1A:
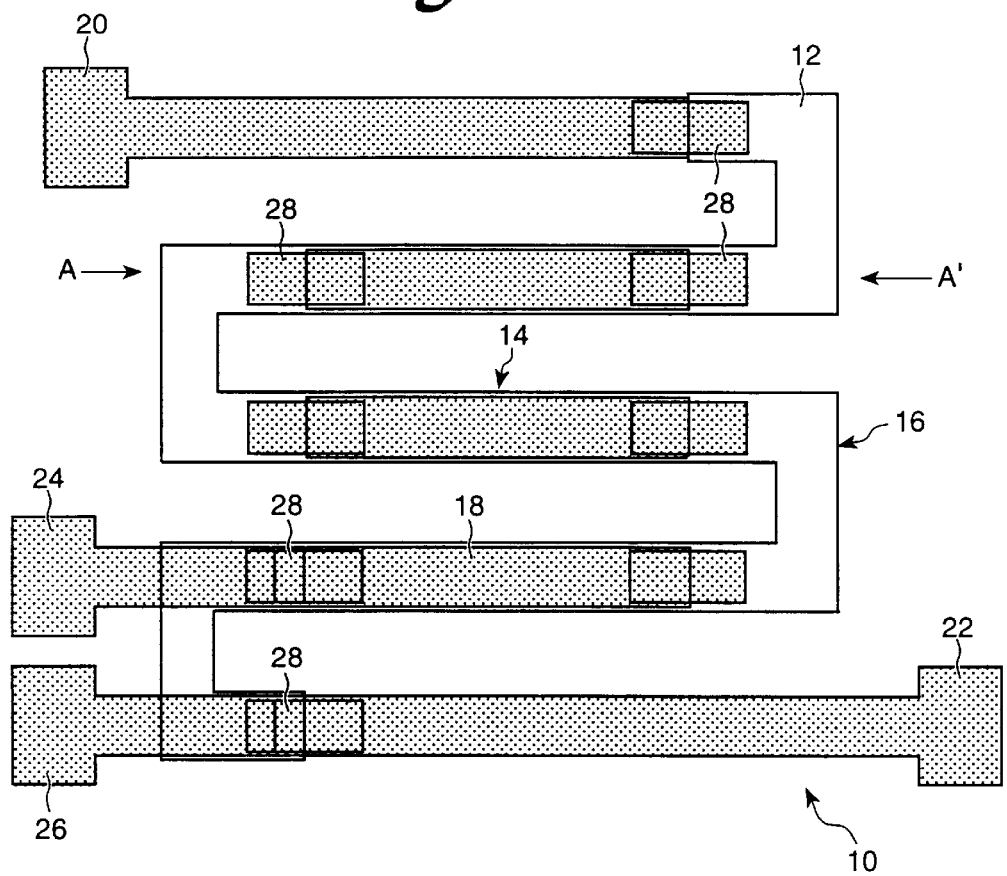
FIGS. 1A and 1B disclose a double bridge test structure for testing polysilicon defects according to a first embodiment of the present invention.

FIG. 1A discloses a circuit diagram of a structure for detecting defect sizes on a semiconductor according to a first preferred embodiment of the present invention. Specifically, FIG. 1A discloses a test structure 10 that is particularly effective in determining defect sizes in polysilicon layers.

As shown in FIG. 1A, the test structure 10 comprises a resistor path 12 that is formed on a semiconductor substrate. As described in more detail below, the resistor path 12 includes a plurality of strip segments 14 and interconnection segments 16 disposed between the strip segments 14. The strip segments 14 and the interconnection segments 16 are arranged to form a continuous resistor path. Typically, the resistivity of the resistor path 12, also referred to as sheet resistance, is 2000 ohms/square and is composed of, for example, a silicon resistor that is doped with n-type impurities.

Figure 1B:
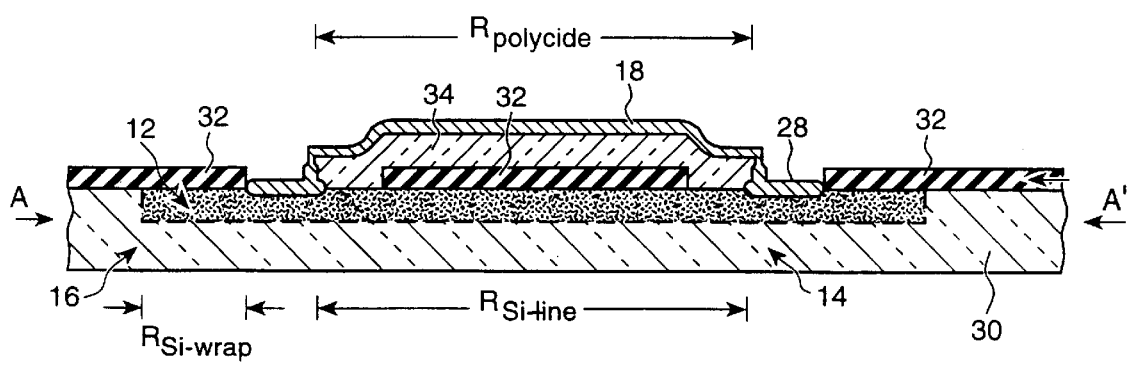

The test structure 10 also includes a plurality of low-resistivity polycide strips 18 formed of a low resistivity semiconductor material, such as polycide, and typically has a resistivity of 2–3 ohms/square. The polycide strips 18 are arranged to correspond with the strip segments 14 of the resistor 12, so that the test structure 10 has a plurality of test strips that have two resistances in parallel. Specifically, as shown in FIG. 1B, the strip segments 14 have a corresponding resistivity ($R_{Si-line}$). Similarly, the interconnection segments 16 have a corresponding resistivity ($R_{Si-wrap}$), and the polycide strips 18 have a corresponding resistivity ($R_{polycide}$). Hence, the test structure 10 has a circuit equivalent of the resistivity of the interconnection segment 16 in series with $R_{polycide}$ and $R_{Si-line}$ in parallel.

If a polysilicon (poly) defect were to form between two of the polycide strips 18 causing a short, then one of the interconnection segments 16 would be bypassed, reducing the composite resistance of the circuit path. Conversely, if the poly defect caused an open in the polycide layer, then the circuit path would follow through the high resistivity strip segment 14, increasing the composite resistance of the test structure 10. Thus, the size of defects can be determined by measuring the composite resistance of the test structure 10 and comparing the measured resistance with the predetermined values of the composite test structure resistance $R_T$, whereby:

$$R_T = 4 \cdot R_{Si-wrap} + 3[R_{polycide} || R_{Si-line}].$$

As shown in FIG. 1A, the test structure 10 includes a first electrode 20 at a first end of the resistor path 12, and a second electrode 22 at a second end of the resistor path 12. The first electrode 20 and second electrode 22 are used to measure the composite resistance of the test structure 10. In addition, the test structure 10 includes a third electrode 24 and a fourth electrode 26 that are connected to measure the resistance of one of the interconnection segments 16.

Finally, the test structure 10 comprises a plurality of local interconnecting sections 28 used to connect the electrodes 20, 22, 24 and 26 and the polycide strips 18 to the resistor path 12. As discussed in detail below, the local interconnecting sections 28 are preferably made of silicide, preferably titanium (Ti)-silicide.

FIG. 1B discloses a simplified cross-section of the test structure 10 along lines A–A'. As shown in FIG. 1B, the resistor path 12 is implanted into the substrate 30 by implanting n-type impurities. The resistor path layer is covered by an oxide layer 32, as well as the local interconnecting sections 28 formed of a silicide. The resistor path 12 is also covered partially with a layer of polysilicon 34. As discussed in more detail below, exposed portions of the silicon resistor path 12 and the polysilicon layer 34 are covered with a layer of a deposited refractory metal silicide, such as titanium. After applying the refractory metal silicide, heat is applied, preferably in the form of Rapid Thermal Annealing (RTA), whereby the titanium reacts with the polysilicon layer 34 and exposed portions of the silicon resistor path 12 to form the polycide strips 18 and the local connecting sections 28 formed of silicide, respectively. A more detailed description of the fabrication process of the test structure in FIG. 1A is given below with reference to FIGS. 2A–2E, FIGS. 3A–3E and FIGS. 4A–4E.

Figure 2A:
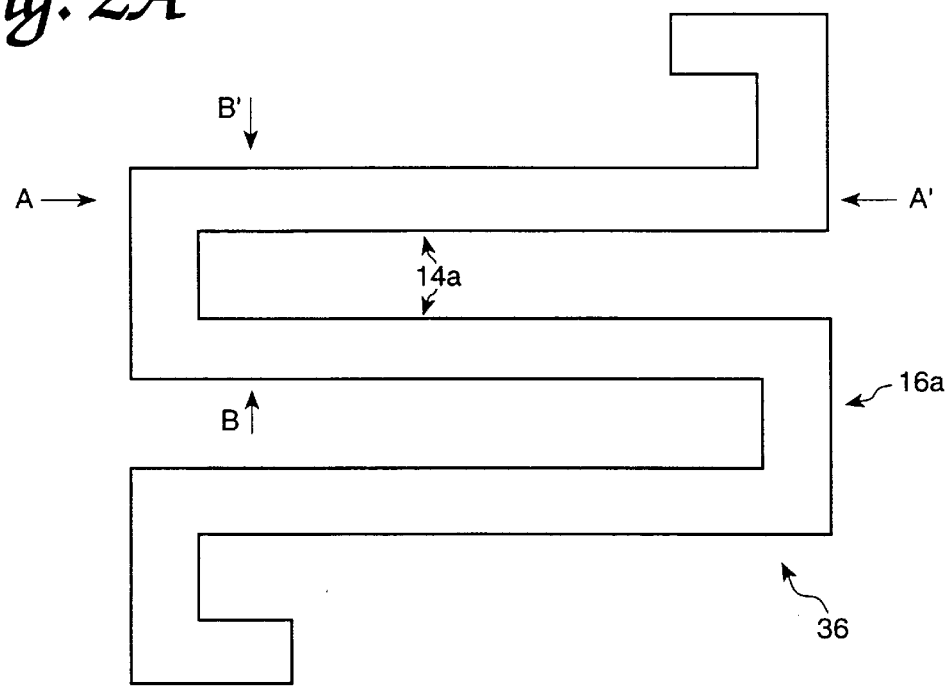
FIGS. 2A–2E disclose an implant mask and method for forming the silicon resistors of the test structure of FIG. 1.

FIGS. 2A–2E depict an implant mask 36 used to define a prescribed region for forming the resistor path 12 shown in FIG. 1A. As shown in FIG. 2A, the implant mask 36 has a shape corresponding to that of the resistor path 12, including the strip segments 14a and the interconnection segments 16a corresponding to the interconnection mask 16 of the resistor path 12.

Figure 2B:
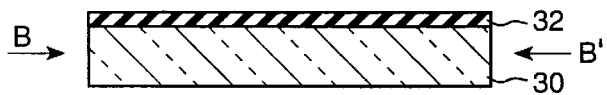
Figure 2C:
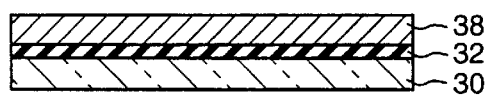
Figure 2D:
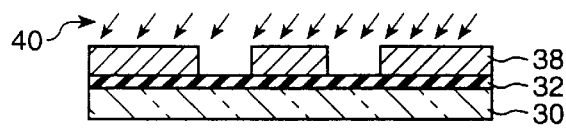
Figure 2E:
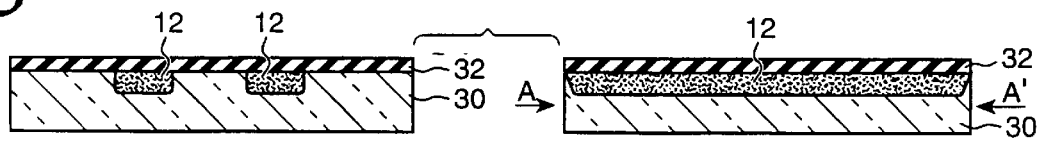

FIGS. 2B–2E show the steps for forming the resistor path 12 along lines A–A' and B–B' of FIG. 2A. In FIG. 2B, a substrate 30 is used as starting material. Preferably, the substrate 30 is a p-type silicon substrate. As shown in FIG. 2B, an oxide layer 32 is grown on the silicon substrate 30 to a thickness of approximately 500 Å. In FIG. 2C, a layer of photoresist 38 is then deposited on the oxide layer 32. The photoresist layer 38 is now etched to the pattern of the implant mask 36. As shown in FIG. 2D, the etched photoresist layer 38 acts as a barrier for the substrate 30 during doping of the substrate 30 with n-type impurities 40. After doping, the photoresist layer 38 is removed. The resulting structure, as shown in FIG. 2E is the silicon substrate 30 comprising n-doped regions forming the resistor path 12.

Figure 3A:
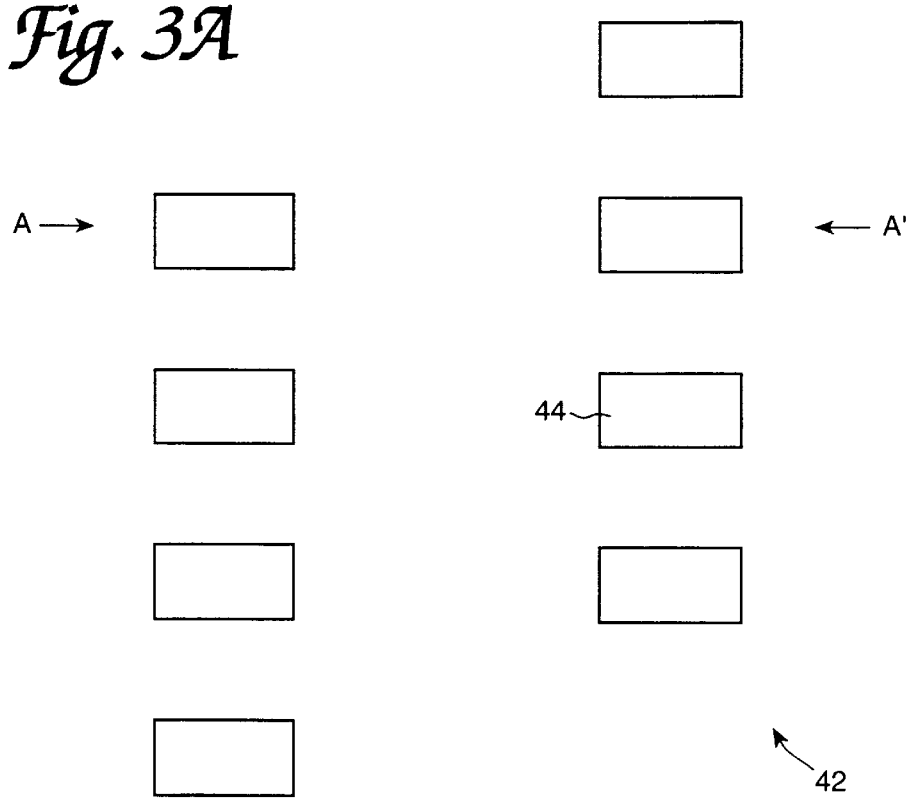
FIGS. 3A–3E disclose an interconnect mask and method for forming the local interconnecting sections of the test structure shown in FIG. 1.

FIG. 3A depicts a pattern of an interconnect mask 42 used to define a prescribed region for forming the local connecting sections 28. As shown in FIG. 3A, an interconnect mask 42 comprises a plurality of prescribed mask regions 44 that are used to define the regions to be silicided. In other words, rather than siliciding an entire area, the silicide process can be selectively performed in order to form local connecting sections 28 as shown in FIG. 1A.

Figure 3B:
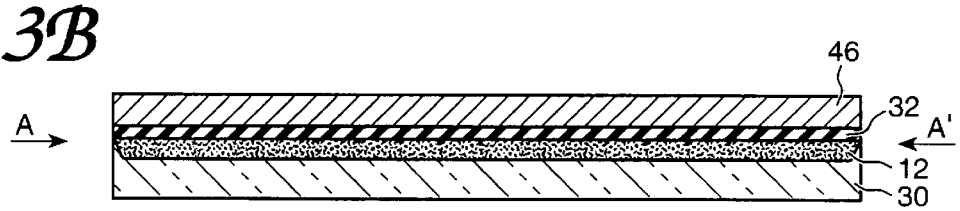
Figure 3C:
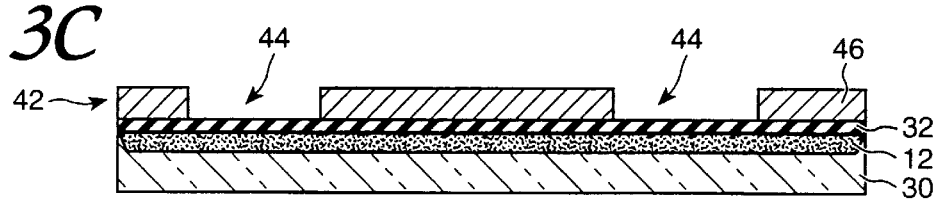
Figure 3D:
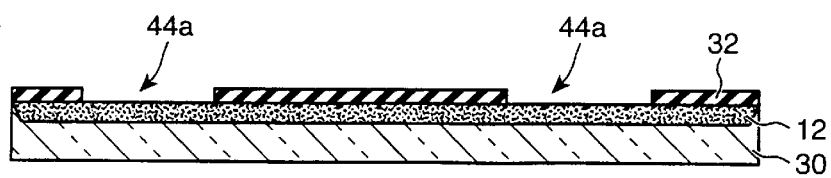
Figure 3E:
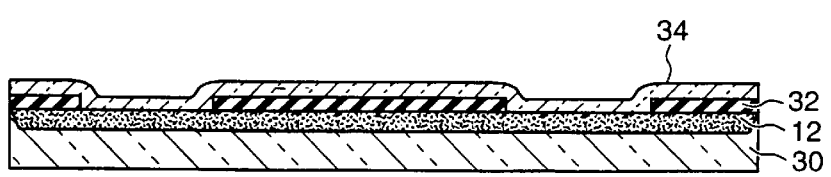

In FIG. 3B, the oxide layer 32 above the resistor path 12 is covered with a photoresist layer 46 to form the interconnect mask 42. In FIG. 3C, the photoresist layer 46 is etched to define the prescribed mask regions 44 to selectively perform the silicide process. After the interconnect mask 42 has been formed on the oxide layer 32, an oxide etch process is performed in order to etch away the portion of the oxide layer 32 exposed by the prescribed mask regions 44. In FIG. 3D, the photoresist layer 46 is removed, resulting in the oxide layer 32 being selectively etched away at the prescribed mask regions 44A. After the selective oxide etching has been performed in FIG. 3D, the polysilicon layer 34 is deposited to cover the portions of the resistor path 12 exposed by the prescribed mask regions 44. As discussed in detail below, portions of the resistor path formed of n-doped silicon will be exposed and covered with titanium to form the silicide local connecting sections 28 after reaction with the titanium.

Figure 4A:
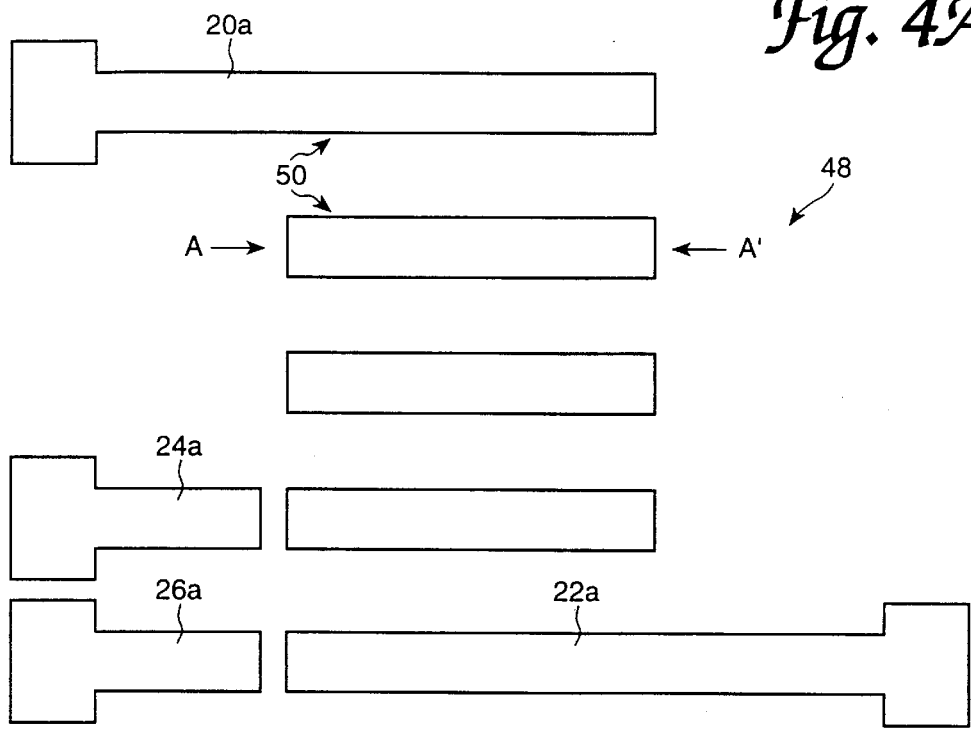
FIGS. 4A–4E disclose a poly mask and method for forming the polycide strips and electrodes of the test structure shown in FIG. 1.
Figure 4B:
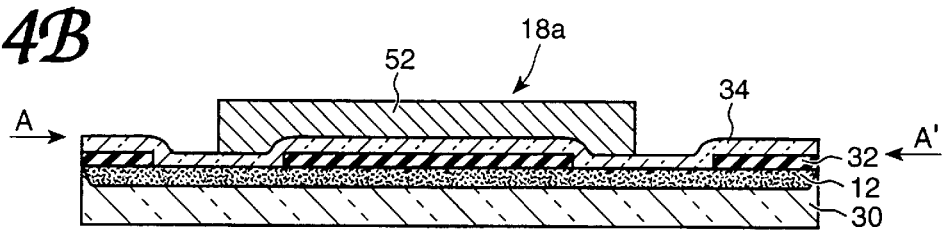

FIG. 4A depicts a poly mask 48 used to define prescribed mask regions 50 to form the polycide strips 18 and the electrodes 20, 22, 24 and 26. For example, reference numeral 20a refers to the prescribed mask region 50 that corresponds to the first electrode 20. Similarly, reference numerals 22a, 24a and 26a refer to the prescribed mask regions 50 that correspond to the second electrode 22, the third electrode 24, and the fourth electrode 26, respectively.

Figure 4C:
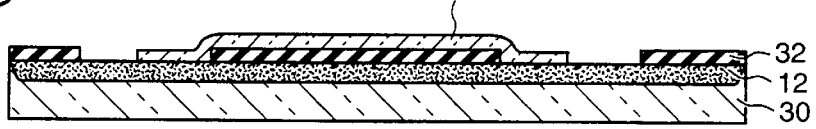
Figure 4D:
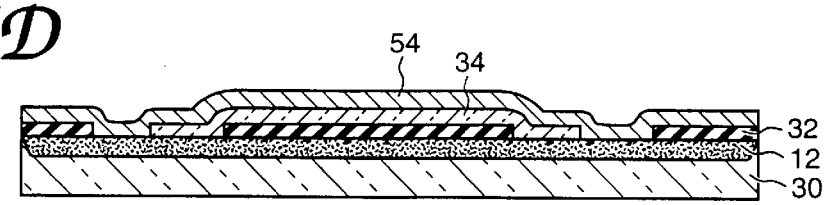

As shown in 4B, a photoresist layer 52 is deposited and etched on the polysilicon layer 34 to define a prescribed mask region 18a corresponding to one of the polycide strips 18. After the poly mask 48 has been formed on the polysilicon layer 34, the exposed portions of the polysilicon layer are etched using a poly-etch process. After the selective etching of the polysilicon layer 34, the photoresist layer 52 is removed resulting in the structure shown in FIG. 4C. As shown in FIG. 4C, the poly-etch process results in a layer of polysilicon 34 that corresponds to the poly mask 48. After the poly lines have been formed as shown in FIG. 4C, a titanium layer 54 is deposited to cover the polysilicon layer 34 and the exposed portions of the silicon resistor path 12, as shown in FIG. 4D. Thus, as shown in FIG. 4D, the titanium layer 54 covers the exposed portions of the resistor path 12 and the polysilicon layer 34.

After the titanium layer 54 is deposited, the semiconductor wafer is placed in a furnace to undergo Rapid Temperature Annealing (RTA), whereby heat is applied to the structure to cause the titanium layer 54 to react with the exposed portion of the silicon resistor path 12 and the polysilicon layer 34 to form silicide and polycide, respectively. During the RTA process, the silicon structure is heated in an oxygen-free environment at a temperature within a range of 800–1000° C. for time period of between 40–60 seconds. The high temperature causes the silicon and polysilicon to react with the titanium within a very short time period, and the relatively short heating process of 40–60 seconds ensures that other areas of the semiconductor wafer are not adversely affected.

Figure 4E:
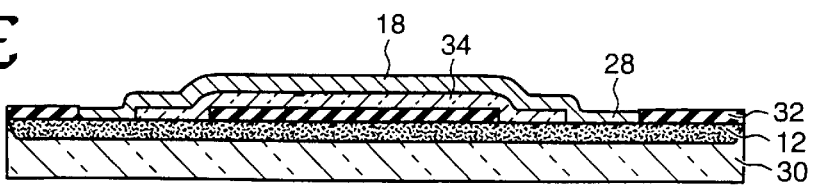

After the heating step is performed, the titanium is stripped from the structure using a wet etch in order to remove any free (i.e., unbonded) titanium. The titanium which bonded with the silicon or polysilicon is not removed by the titanium strip. The heating and Ti-stripping step results in the final structure shown in FIG. 4E, which corresponds to the structure as shown in FIG. 1B. As shown in FIG. 4E, the completed structure comprises the n-doped resistor path 12, the polycide-formed polycide strips 18 at the exposed edge of the polysilicon layer 34, and the local connecting sections 28 formed of silicide. In FIG. 4E, the polycide strip 18 and the silicide local connecting sections 28 are formed as a smooth continuous layer, since the reactants polysilicon and silicon are both silicon products, except that the polysilicon has a polycrystalline structure.

Therefore, the test structure 10 according to the first embodiment of the present invention is particularly advantageous for testing for polysilicon defects in polysilicon layers, as well as defects causing open circuits in the polysilicon layer. Silicidation occurs only in the silicon and polysilicon areas uncovered by the oxide films. As shown in FIG. 1A, the n-type resistors in the interconnection segments 16 and underneath the polycide strips 18 are not silicided, so that the resistor values $R_{Si-wrap}$ and $R_{Si-line}$ correspond to the resistivity of the silicon resistor, namely 2000 ohms/square. Moreover, the local interconnecting sections 28 made of silicide are defined by the interconnect mask 42, thereby providing efficient interconnections between the polycide formed electrodes 20, 22, 24 and 26, and the polycide strips 18, with the resistor path 12.

Figure 5:
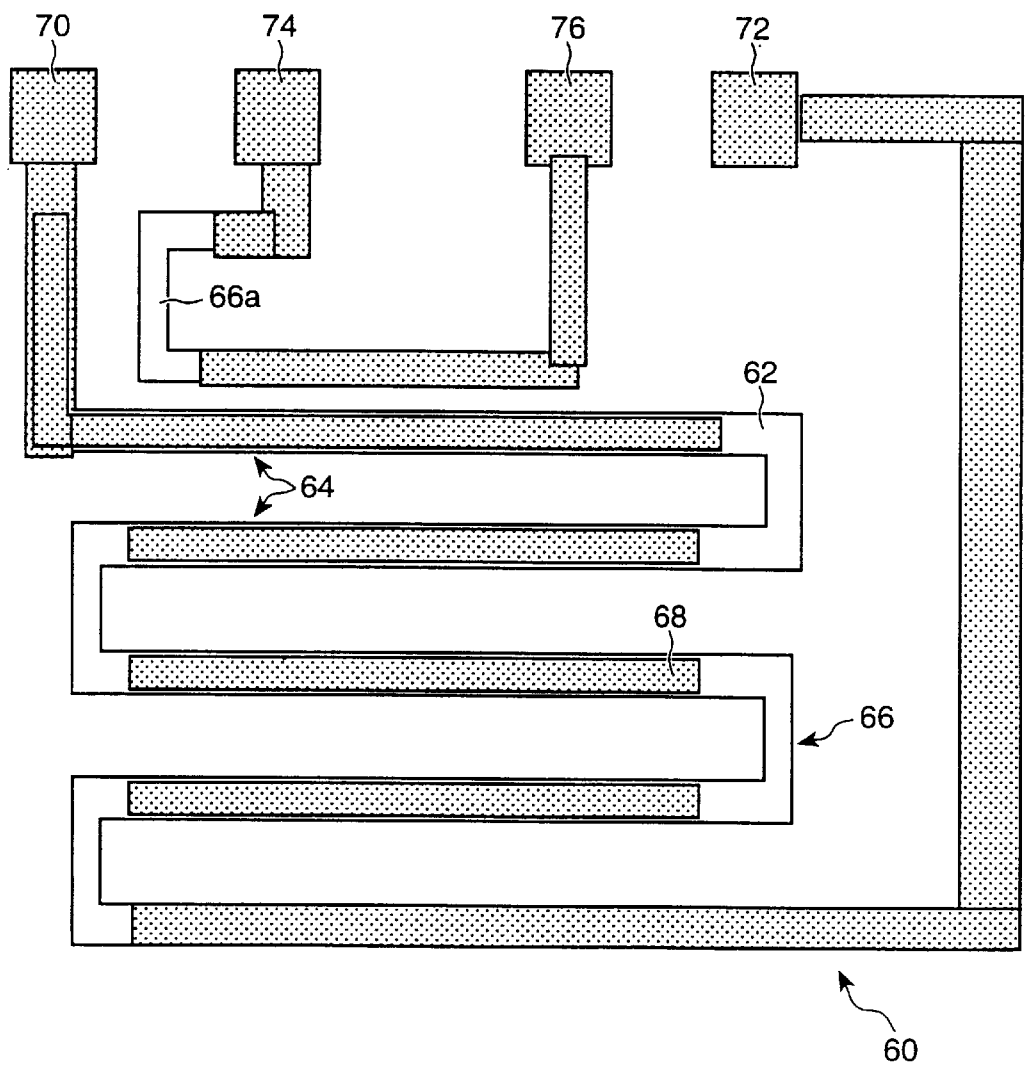
FIG. 5 discloses a double bridge test structure for detecting defect sizes for source-drain defects in a metal oxide semiconductor according to a second embodiment of the present invention.

FIG. 5 depicts a second preferred embodiment of the present invention, namely source-drain test structure 60 for testing defects in the source-drain layer of a metal oxide semiconductor such as a MOSFET. The source drain test structure 60 is particularly adapted to the requirements of a metal oxide semiconductor using a single layer for the source-drain region. In other words, metal oxide semiconductors are difficult to test for defects in source-drain layers because the source-drain layer is essentially built-in silicon. Since the source-drain layer is the lowest layer above the substrate, no additional layer can be built below the source-drain layer. Hence, as shown in FIG. 5, the source-drain test structure 60 provides a resistor pattern 62 built into the source-drain layer and a low-resistivity path built on the resistor pattern 62. The resistor pattern 62 corresponds to the resistor path 12 shown in FIG. 1A, and as such includes strip segments 64 and interconnection segments 66. In addition, the source drain test structure 60 includes a test interconnection segment 66a in order to measure the resistance of the corresponding interconnection segments 66.

The source-drain test structure also comprises low-resistance silicide strips 68 that make up the low resistance portion of the source-drain test structure 60. In addition, a first electrode 70 and second electrode 72 are used to test the resistance of the overall source-drain structure, similar to the electrodes 20 and 22 of the test structure 10 shown in FIG. 1A. A third electrode 74 and fourth electrode 76 are also connected to the test interconnection segment 66a to measure the corresponding resistance.

A description of the steps for forming the source-drain test structure 60 will now be provided with respect to FIGS. 6A–6F and FIGS. 7A–7F.

FIG. 6A depicts a source-drain mask 78 used to prescribe the active areas forming the resistors and electrodes. As shown in FIG. 6A, the source-drain mask 78 covers the entire source-drain test structure 60. Upon completion of the resistor pattern 62, a resistor protect mask will be provided to cover the resistor formed from reacting with subsequently supplied titanium, as discussed in detail below with respect to FIGS. 7A–7F.

FIG. 6B shows the steps for forming the source-drain test structure 60 along line B–B' of FIG. 6A. In FIG. 6B, a p-type silicon substrate 80 is used as starting material. An oxide layer 82 with thickness of about 200 Å is grown on the silicon substrate 80. After formation of the oxide layer 82, a nitride layer 84 is deposited on the oxide layer 82. As shown in FIG. 6C, the nitride layer 84 is etched to form the source-drain mask 78. As shown in FIGS. 6A, 6C and FIG. 5, the left nitride etch 84a corresponds to the test interconnection segments 66a, whereas the right nitride etch 84b corresponds to one of the strip segments 64 of the resistor pattern 62. After formation of the source-drain mask 78, the oxide layer 82 undergoes field oxidation in order to provide a field-oxidized oxide layer 82a. Thus, after the nitride-etched source-drain mask 78 is removed, the result is a locally-oxidized silicon structure (LOCOS) as shown in FIG. 6D. Specifically, FIGS. 6D shows the field oxidized layer which defines barrier regions 86 and unreacted regions 88 corresponding to the source-drain mask.

After field oxidation and nitride strip, the field oxidized layer 82a is etched back, exposing portions of the substrate 80. The exposed portions 90 correspond to those regions of the substrate 80 to receive impurity implantation to form the resistor pattern 62. As shown in FIG. 6E, a layer of resistor protect oxide 92 is applied over the exposed portions 90 and the barrier regions 86 of the field oxidized layer 82a. After the resistor protect oxide layer 92 is deposited, an n-type dopant 94 is implanted to form impurity regions 96 in the substrate 80. These impurity regions form the resistor pattern 62 and the test interconnection segment 66a.

FIG. 7A shows a resistor protect mask 98 used to prescribe the regions to expose for silicide formation. In FIG. 7A, the resistor protect mask 98 defines the regions corresponding to the silicide strip 68, and the electrodes 70, 72, 74 and 76. As shown in FIG. 7B, a photoresist layer 100 is deposited over the resistor protect oxide layer 92 and etched to form the exposed region for the resistor protect mask 98. After the resistor protect mask 98 has been formed in the photoresist layer 100, a resistor-protect oxide-etch is performed to uncover the impurity region 96a. The exposed impurity region 96a shown in FIG. 7C corresponds to the portion of the source-drain test structure that includes both a portion of the resistor pattern 62 and either the silicide strips 68 or one of the electrodes, shown in FIG. 5. As shown in FIG. 7D, the exposed impurity region 96a and the resistor protect oxide layer 92 are covered with a titanium layer 102 which is deposited on the semiconductor wafer. After the titanium layer 102 is deposited, the titanium layer 102 is heated to cause a reation with the exposed impurity region 96a in order to form a silicide resistor 104 having a resistance on the order of 2 to 3 ohms/square. As shown in FIG. 7E, the silicide resistor 104 is formed on the top portion of the exposed impurity region 96a. Hence, the parallel-resistance structure of the resistor having the exposed impurity region 96a and the silicide resistor 104 is formed within a single layer of the metal oxide semiconductor.

As with the embodiment shown in FIG. 1A, the silicide is preferably formed using a titanium-silicide RTA. Since the silicide-forming process occurs only in the area uncovered by the oxide film, the parallel-formed resistors can be fabricated on the silicon substrate. As a result, only a single layer of the source-drain layer is needed to form the structure.

After the silicide resistor 104 is formed, a titanium strip is performed to eliminate the unbonded titanium layer 102 and the resistor protect oxide. The resulting structure, as shown in FIG. 7F, is the test interconnection segment 66a formed by the impurity region 96, and the silicide strip 68 connected to the strip segment 64. Thus, the disclosed structure is particularly effective for testing for shorts caused by source-drain defects.

A method of testing for defects using the test structure 10 for poly layers will now be described. As described above, the test structure 10 shown in FIG. 1A comprises a resistor path 12 composed of three strip segments 14. Although only three strip segments 14 are shown, in actual implementation the actual number of strip segments could be much larger, for example ten or twenty strip segments. Each of the strip segments 14 have approximately the same resistance, defined as $R_{Si-line}$. The resistor path 12 also comprises four interconnection segments 16 each having a resistance value of $R_{Si\text{-}wrap}$. The silicon resistor path 12 is made of a n-doped silicon having a resistance of approximately 2000 ohms/square. Each of the polycide strips 18 in the electrodes 20, 22, 24, 26 have a resistance on the order of 2–3 ohms/square. Hence, each of the polycide strips 18 have a resistance value $R_{polycide}$, which is substantially less than the resistance of $R_{Si\text{-}wrap}$.

In order to test for a short, or bridging defect, the resistance value $R_{12}$ is measured between the first electrode 20 and the second electrode 22. In the next step, the resistance value $R_{Si\text{-}wrap}$ is measured between the third electrode 24 and the fourth electrode 26. If there is no polycide line short, then the resistance $R_{12}$ of the test structure 10 will equal to $R_{12}=4 \cdot R_{Si\text{-}wrap}+5 \cdot R_{polycide}$. Since $R_{Si\text{-}wrap} \gg R_{polycide}$, the resistance value $R_{12} \approx 4 \cdot R_{Si\text{-}wrap}$. Therefore, if the ratio N is:

$$N=R_{12}/R_{Si\text{-}wrap}=4,$$

then there is no line short.

In the event that two polycide lines are short, then $R_{12}=3 \cdot R_{Si\text{-}wrap}+4 \cdot R_{polycide}$. Since $R_{Si\text{-}wrap} \gg R_{polycide}$, then $R_{12} \approx 3 \cdot R_{Si\text{-}wrap}$.

Thus, the ratio N is:

$$N=R_{12}/R_{Si\text{-}wrap}=3,$$

indicating that there are two lines short. In this case, the poly defect size is larger than the space between polycide lines and less than the sum of two polycide lines-width and one polycide line. Therefore, the number of the lines shorted is determined by measuring $R_{12}/R_{Si\text{-}wrap}$. The size of the defect is then determined by the number of lines short, and the predetermined width and spacing of the polycide strips 18.

To test for open defects in the polycide layer, the resistance $R_{12}$ is measured from the first electrode 20 and the second electrode 22. The resistance of $R_{Si\text{-}wrap}$ is then determined by measuring the third electrode 24 and the fourth electrode 26. If one polycide line is open, then $R_{12}=4 \cdot R_{Si\text{-}wrap}+4 \cdot R_{polycide}+R_{Si\text{-}line}$. Since $R_{Si\text{-}wrap} \gg R_{polycide}$, then $R_{12} \approx 4 \cdot R_{Si\text{-}wrap}+R_{Si\text{-}line}$. Thus, the structure 10 can also test for open defects in the poly layer. As will be appreciated by those skilled in the art, in order to obtain consistent readings, the strip segments and interconnection segments 16 should be designed so that $R_{Si\text{-}line} \gg R_{Si\text{-}wrap}$. Hence, if an open defect is present, the resistance value will be:

$$R_{12} \approx R_{Si\text{-}line}$$

A method of testing for defects causing a short, or bridging in the source-drain layers will now be described with respect to the source-drain test structure 60 of the second embodiment disclosed in FIGS. 5–7. The first step is to measure the composite resistance of the source-drain test structure by measuring the resistance value $R_{12}$ between the first electrode 70 and the second electrode 72. The resistance across the third electrode 74 and the fourth electrode 76 is also measured to obtain $R_{Si\text{-}wrap}$. If there are no shorts in the line, then the resistance $R_{12}=4\ R_{Si\text{-}wrap}+5\ R_{silicide\text{-}line}$, whereby $R_{silicide\text{-}line}$ corresponds to the resistance of one of the silicide strips 68. Since $R_{Si\text{-}wrap} \gg R_{silicide\text{-}line}$, the resistance $R_{12} \approx 4 \cdot R_{Si\text{-}wrap}$. Therefore, if the ratio N is:

$$N=R_{12}/R_{Si\text{-}wrap}=4,$$

then there is no line short.

If, however, two lines are short, then:

$$R_{12}=3 \cdot R_{Si\text{-}wrap}+4\ R_{silicide\text{-}line} \approx 3\ R_{Si\text{-}wrap}.$$

Thus, the ratio N is:

$$N=R_{12}/R_{Si\text{-}wrap}=3,$$

indicating that there are two lines short. Thus, the source-drain test structure 60 is able to test for defect in a source-drain layer of a metal oxide semiconductor. Of course, it will be appreciated that the structure of the second embodiment and the fabrication methods thereof may be applied to other semiconductor devices, whereby only defects causing short circuits need to be tested.

Thus, the structure in FIG. 5 is especially well-suited for high density semiconductor devices. For example, the test structure shown in FIG. 5 has been tested on semiconductor wafers using 0.35 micron technology.

Hence, the present invention provides testing for defects in semiconductor layers using strips of a semiconductor material having a first resistance connected in parallel with strips of a second semiconductor material having a substantially different resistance. Although the disclosed embodiments provide for low-resistance lines that are implemented as silicide or polycide, it will be appreciated that alternative elements or compounds may be used to form different low-resistance strips, so long as the low-resistivity strips are substantially less than the high-resistivity strips, in this case disclosed as the resistor paths having resistor values on the order of 2000 ohms/square.

It will also be appreciated that different dopants may be used to form testing structures according to the present invention that test defects in different semiconductor layers. In addition, although titanium is disclosed as the preferred element for forming the silicide and polycide structures, it will be appreciated that other refractory metal suicides may be used to provide the low-resistivity structures.

While this invention has been described in connection with what is presently considered to be the most practical and preferred embodiments, it is to be understood that the invention is not limited to the disclosed embodiments but, on the contrary, is intended to cover various modifications and equivalent arrangements included within the spirit and scope of the appended claims.

What is claimed is:

1. A method for forming a semiconductor structure on a semiconductor substrate for detecting short circuits and open circuits due to defects on the semiconductor, the semiconductor having a silicon substrate, the method comprising the steps of:

forming an oxide layer on said silicon substrate;

forming an implant mask on said oxide layer, said implant mask defining a first prescribed region;

implanting said first prescribed region with a dopant to form a silicon resistor strip;

forming an interconnect mask on said oxide layer defining second prescribed regions;

etching said oxide layer at said second regions;

depositing a polysilicon layer on said semiconductor overlying said silicon resistor strip and said oxide layer;

selectively masking said polysilicon layer at third prescribed regions such that portions of said polysilicon layer remain exposed;

etching said exposed polysilicon layer portions;

depositing a refractory metal silicide layer on said semiconductor overlying said second and third regions;

applying heat to cause said deposited refractory metal silicide to react with a portion of said silicon resistor strip exposed at said second regions and said polysilicon at said third regions to form silicide and polycide as interconnecting and low-resistivity portions, respectively.

2. A method as recited in claim 1, wherein said implant mask forming step comprises the step of shaping said implant mask to include a plurality of strip segments and interconnection segments disposed between said strip segments to form said silicon resistor strip.

3. A method as recited in claim 2, wherein said plurality of strip segments are mutually parallel.

4. A method as recited in claim 2, wherein said selectively masking step comprises the step of selectively defining said third prescribed regions to include a plurality of strips corresponding to said strip segments of said implant mask.

5. A method as recited in claim 4, wherein said interconnect mask forming step comprises the step of defining said second prescribed regions to be disposed at ends of said strip segments of said implant mask and ends of said corresponding strips of said third regions.

6. A method as recited in claim 5, wherein said selectively masking step further comprises the step of defining a portion of said third prescribed regions as first and second electrode regions corresponding to respective ends of one of said interconnection segments.

7. A method as recited in claim 6, wherein said selectively masking step further comprises the step of defining a portion of said third prescribed regions as third and fourth electrode regions corresponding to one of said first and second ends of said silicon resistor, respectively.

8. A method as recited in claim 1, wherein said refractory metal silicide is titanium.

9. A method as recited in claim 1, wherein said applying step comprises the step of performing Rapid Thermal Annealing for said deposited refractory metal.

10. A method as recited in claim 9, wherein said Rapid Thermal Annealing step comprises the steps of applying heat to the refractory metal silicide overlying said second and third regions in an oxygen-free environment at a temperature within a range of 800 to 1000 degrees centigrade, for about sixty seconds.

* * * * *